(12) United States Patent
Bian

(10) Patent No.: US 12,321,010 B2
(45) Date of Patent: Jun. 3, 2025

(54) PHOTODETECTORS WITH A TAPERED INTERFACE

(71) Applicant: GlobalFoundries U.S. Inc., Malta, NY (US)

(72) Inventor: Yusheng Bian, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 295 days.

(21) Appl. No.: 18/084,921

(22) Filed: Dec. 20, 2022

(65) Prior Publication Data

US 2024/0201438 A1 Jun. 20, 2024

(51) Int. Cl.
*G02B 6/122* (2006.01)
*G02B 6/13* (2006.01)
*H10F 30/223* (2025.01)
*H10F 71/00* (2025.01)
*H10F 77/122* (2025.01)
*H10F 77/40* (2025.01)

(52) U.S. Cl.
CPC .......... *G02B 6/1228* (2013.01); *G02B 6/13* (2013.01); *H10F 30/223* (2025.01); *H10F 71/1212* (2025.01); *H10F 77/122* (2025.01); *H10F 77/413* (2025.01)

(58) Field of Classification Search
CPC .................................................. G02B 6/1228
See application file for complete search history.

(56) References Cited

U.S. PATENT DOCUMENTS

| 6,897,498 | B2* | 5/2005 | Gothoskar | ............ G02B 6/125 257/233 |
| 10,910,503 | B1 | 2/2021 | Bian et al. | |
| 10,914,892 | B2* | 2/2021 | Bayn | ............ H01L 31/105 |
| 11,199,672 | B1 | 12/2021 | Holt et al. | |
| 11,520,113 | B1 | 12/2022 | Aboketaf et al. | |
| 2009/0324164 | A1* | 12/2009 | Reshotko | ............ G02B 6/1228 257/432 |
| 2021/0157068 | A1 | 5/2021 | Gothoskar et al. | |
| 2022/0350079 | A1 | 11/2022 | Aboketaf et al. | |
| 2024/0201438 | A1* | 6/2024 | Bian | ............ H01L 31/02327 |

OTHER PUBLICATIONS

Matthew J. Byrd et al., "Mode-evolution-based coupler for high saturation power Ge-on-Si photodetectors," Optics Letter 42, 851-854 (2017).
Xiao Hu et al., "High-speed and high-power germanium photodetector with a lateral silicon nitride waveguide," Photonics Research 9, 749-756 (2021).

(Continued)

*Primary Examiner* — Rhonda S Peace
(74) *Attorney, Agent, or Firm* — Thompson Hine LLP; Anthony Canale

(57) ABSTRACT

Structures including a photodetector and methods of forming a structure including a photodetector. The structure comprises a photodetector including a pad having a side edge and a light-absorbing layer disposed on the pad. The structure further comprises a waveguide core including a tapered section positioned adjacent to the side edge of the pad and the light-absorbing layer. The tapered section has a width dimension that decreases with decreasing distance from the side edge of the pad.

18 Claims, 10 Drawing Sheets

(56) References Cited

OTHER PUBLICATIONS

Yan Zuo, Yu Yu, Yu Zhang, De Zhou, and Xinliang Zhang, "Integrated high-power germanium photodetectors assisted by light field manipulation," Optics Letter 44, 3338-3341 (2019).
Shirong Liao et al., "36 GHz submicron silicon waveguide germanium photodetector," Optics Express 19, 10967-10972 (2011).
Ning-Ning Feng et al., "Vertical p-i-n germanium photodetector with high external responsivity integrated with large core Si waveguides," Optics Express 18, 96-101 (2010).
S. Rauch, D. Lee, A. Vert, L. Jiang and B. Min, "Reliability Failure Modes of an Integrated Ge Photodiode for Si Photonics," 2020 Optical Fiber Communications Conference and Exhibition (OFC), 2020, pp. 1-3.
Nicholas J. D. Martinez et al., "High performance waveguide-coupled Ge-on-Si linear mode avalanche photodiodes," Optics Express 24, 19072-19081 (2016).
K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611, doi: 10.1109/JSTQE.2019.2908790.
M. Rakowski et al., "45nm CMOS—Silicon Photonics Monolithic Technology (45CLO) for next-generation, low power and high speed optical interconnects," in Optical Fiber Communication Conference (OFC) 2020, OSA Technical Digest (Optica Publishing Group), paper T3H.3 (2020).
Y. Bian et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optica Publishing Group), paper FW5D.2 (2020).
Y. Bian et al., "Hybrid III-V laser integration on a monolithic silicon photonic platform," in Optical Fiber Communication Conference (OFC) 2021, P. Dong, J. Kani, C. Xie, R. Casellas, C. Cole, and M. Li, eds., OSA Technical Digest (Optica Publishing Group), paper M5A.2 (2021).
Y. Bian et al., "3D Integrated Laser Attach Technology on 300-mm Monolithic Silicon Photonics Platform," 2020 IEEE Photonics Conference (IPC), 2020, pp. 1-2, doi: 10.1109/IPC47351.2020.9252280.
B. Peng et al., "A CMOS Compatible Monolithic Fiber Attach Solution with Reliable Performance and Self-alignment," In Optical Fiber Communication Conference (OFC), OSA Technical Digest (Optica Publishing Group, 2020), paper Th3I.4 (2020).
Y. Bian et al., "Monolithically integrated silicon nitride platform," 2021 Optical Fiber Communications Conference and Exhibition (OFC), pp. 1-3 (2021).
A. Aboketaf et al., "Towards fully automated testing and characterization for photonic compact modeling on 300-mm wafer platform," 2021 Optical Fiber Communications Conference and Exhibition (OFC), 2021, pp. 1-3.
A. Chowdhury et al., "High Performance Avalanche Photodiode in a Monolithic Silicon Photonics Technology," 2022 Optical Fiber Communications Conference and Exhibition (OFC), 2022, pp. 1-3.
J. K. Cho et al., "Optical performance and reliability assessment from self-aligned single mode fiber attach for O-band silicon photonics platform," 2022 IEEE 72nd Electronic Components and Technology Conference (ECTC), 2022, pp. 403-409, doi: 10.1109/ECTC51906.2022.00072.
Bian, Yusheng et al., "Photodetectors Integrated With an Inverse Taper Including a Curved Tip" filed Dec. 15, 2021 as a U.S. Appl. No. 17/551,544.
Aboketaf, Abdelsalam et al., "Multi-Mode Optical Waveguide Structures With Isolated Absorbers" filed Nov. 2, 2020 as a U.S. Appl. No. 17/087,182.
Bian, Yusheng, "Photonic Structure With Waveguide-to-Photodetector Coupler Oriented Along Sidewall of a Photodetector" filed Oct. 27, 2022 as a U.S. Appl. No. 18/050,147.
European Patent Office, Extended European Search Report and Opinion issued in European Patent Application No. 23204514.6 on Mar. 22, 2024; 10 pages.

\* cited by examiner

PHOTODETECTORS WITH A TAPERED INTERFACE

BACKGROUND

The disclosure relates to semiconductor device fabrication and integrated circuits and, more specifically, to structures including a photodetector and methods of forming a structure including a photodetector.

Photonics chips are used in many applications and systems including, but not limited to, data communication systems and data computation systems. A photonics chip integrates optical components and electronic components into a unified platform. Among other factors, layout area, cost, and operational overhead may be reduced by the integration of both types of components on the same chip.

Photonics chips may include photodetectors that convert light, which may be modulated as an optical signal, into an electrical signal. A photodetector may suffer from mode mismatch and significant back reflection due to a refractive index mismatch between the light-absorbing material (e.g., germanium) of the photodetector and the material (e.g., silicon) of a waveguide core supplying the light to the light-absorbing material. The mode mismatch and back reflection degrade the coupling efficiency to the photodetector. In particular, the coupling efficiency for transverse-magnetic polarized light may be low in comparison with the coupling efficiency for transverse-electric polarized light.

Improved structures including a photodetector and methods of forming a structure including a photodetector are needed.

SUMMARY

In an embodiment of the invention, a structure comprises a photodetector including a pad having a side edge and a light-absorbing layer disposed on the pad. The structure further comprises a waveguide core including a tapered section positioned adjacent to the side edge of the pad and the light-absorbing layer. The tapered section has a width dimension that decreases with decreasing distance from the side edge of the pad.

In an embodiment of the invention, a method comprises forming a photodetector including a pad having a side edge and a light-absorbing layer disposed on the pad. The structure further comprises forming a waveguide core including a tapered section positioned adjacent to the side edge of the pad and the light-absorbing layer. The tapered section has a width dimension that decreases with decreasing distance from the side edge of the pad.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
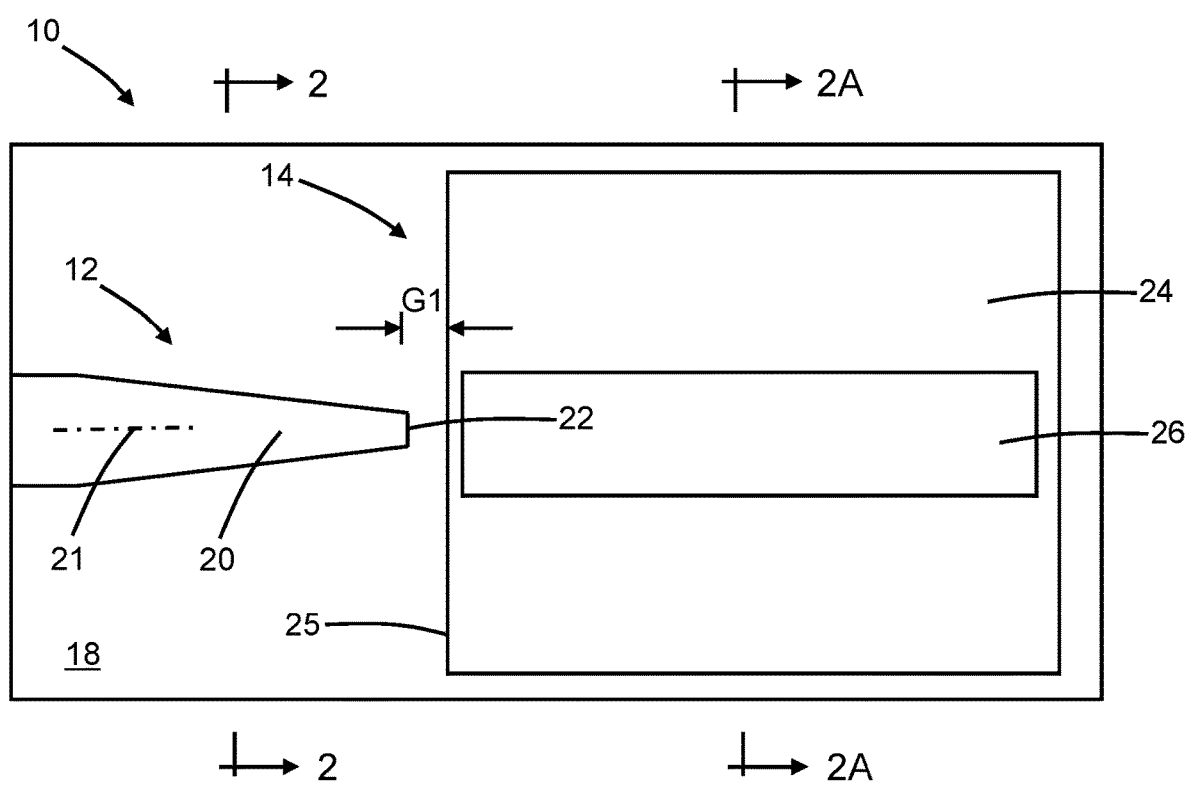
FIG. 1 is a top view of a structure at an initial fabrication stage of a processing method in accordance with embodiments of the invention.
Figure 2:
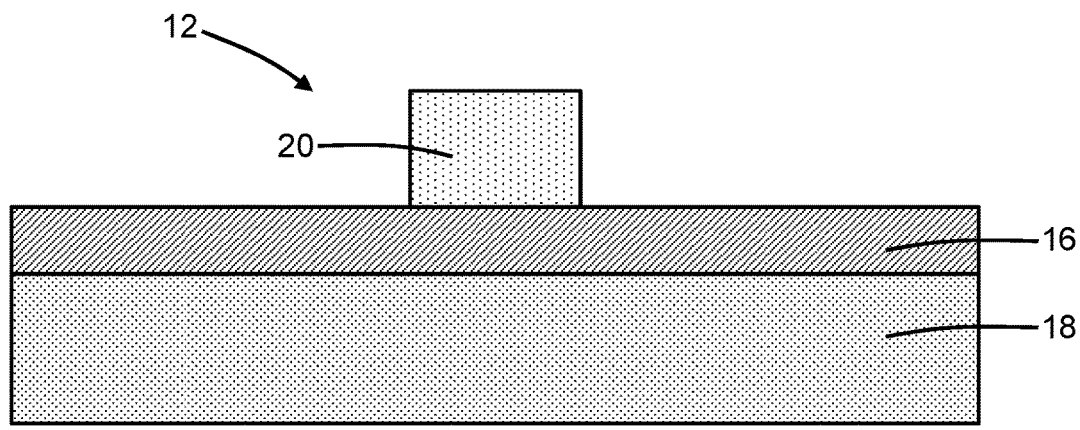
FIG. 2 is a cross-sectional view taken generally along line 2-2 in FIG. 1.
Figure 2A:
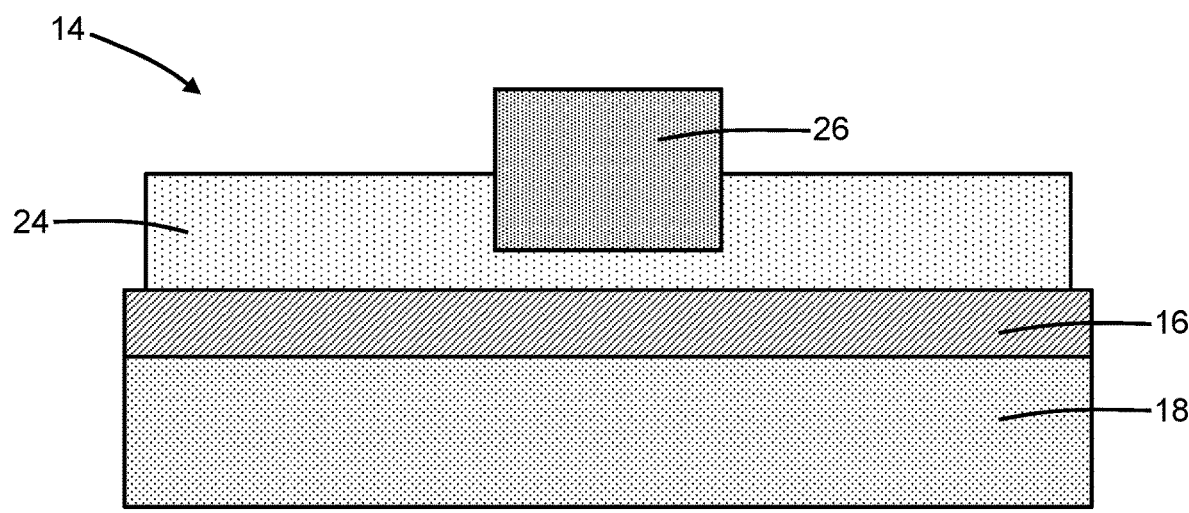
FIG. 2A is a cross-sectional view taken generally along line 2A-2A in FIG. 1.

With reference to FIGS. 1, 2, 2A and in accordance with embodiments of the invention, a structure 10 includes a waveguide core 12 and a photodetector 14 that are positioned on, and above, a dielectric layer 16 and a semiconductor substrate 18. In an embodiment, the dielectric layer 16 may be comprised of a dielectric material, such as silicon dioxide, and the semiconductor substrate 18 may be comprised of a semiconductor material, such as single-crystal silicon. In an embodiment, the dielectric layer 16 may be a buried oxide layer of a silicon-on-insulator substrate, and the buried oxide layer may separate the waveguide core 12 and the photodetector 14 from the semiconductor substrate 18.

The waveguide core 12 includes a tapered section 20 that is positioned adjacent to the photodetector 14 and that extends along a longitudinal axis 21. The tapered section 20 may terminate at an end 22, and the tapered section 20 has a width dimension that may increase with increasing distance from the end 22. In an embodiment, the width dimension of the tapered section 20 may increase linearly with increasing distance from the end 22. In an alternative embodiment, the width dimension of the tapered section 20 may vary based on a non-linear function, such as a quadratic function, a cubic function, a parabolic function, a sine function, a cosine function, a Bezier function, or an exponential function. In an embodiment, the tapered section 20 may include a single stage of tapering characterized by a taper angle. In an alternative embodiment, the tapered section 20 may taper in multiple stages each characterized by a different taper angle. In an alternative embodiment, the semiconductor substrate 18 may include a cavity beneath all or part of the tapered section 20 of the waveguide core 12.

The photodetector 14 includes a pad 24 having a side edge 25 and a light-absorbing layer 26 that is integrated into the pad 24. In an embodiment, the end 22 of the tapered section 20 may be spaced from the side edge 25 of the pad 24 of the photodetector 14 by a gap G1. In an embodiment, the end 22 of the tapered section 20 may be spaced from the nearest edge of the light-absorbing layer 26 by a gap that is slightly greater than the gap G1. In an alternative embodiment, the edge of the light-absorbing layer 26 closest to the end 22 of the tapered section 20 may coincide with the side edge 25 of the pad 24. In an embodiment, the gap G1 may have a dimension that is greater than zero (0) and less than or equal to two (2) microns. The width dimension of the tapered section 20 may decrease with decreasing distance from the side edge 25 of the pad 24. In an alternative embodiment, the longitudinal axis 21 of the tapered section 20 may be angled to reduce optical return loss from the side edge 25 of the pad 24 and the light-absorbing layer 26.

In an embodiment, the waveguide core 12 and the pad 24 of the photodetector 14 may be comprised of a material having a refractive index that is greater than the refractive index of silicon dioxide. In an embodiment, the waveguide core 12 and the pad 24 of the photodetector 14 may be comprised of a semiconductor material. In an embodiment, the waveguide core 12 and the pad 24 of the photodetector 14 may be comprised of single-crystal silicon. The waveguide core 12 and the pad 24 of the photodetector 14 may be formed by patterning a layer comprised of the constituent material with lithography and etching processes. In an embodiment, the waveguide core 12 and the pad 24 of the photodetector 14 may be concurrently formed by patterning the semiconductor material (e.g., single-crystal silicon) of a device layer of a silicon-on-insulator substrate.

The light-absorbing layer 26 may be comprised of a material that generates charge carriers from absorbed light by the photoelectric effect. In an embodiment, the light-absorbing layer 26 may comprise a material having a composition that includes germanium. In an embodiment, the light-absorbing layer 26 may comprise intrinsic germanium.

The light-absorbing layer 26 may be formed by an epitaxial growth process. The light-absorbing layer 26 may be epitaxially grown inside a trench that is patterned in the pad 24 such that the light-absorbing layer 26 includes a portion arranged below the top surface of the pad 24 and a portion that projects above the top surface of the pad 24. In an alternative embodiment, the light-absorbing layer 26 may be epitaxially grown on a top surface of the pad 24 and not inside a trench. One or more conformal dielectric layers (not shown) may be formed that extend across the light-absorbing layer 26.

Figure 3:
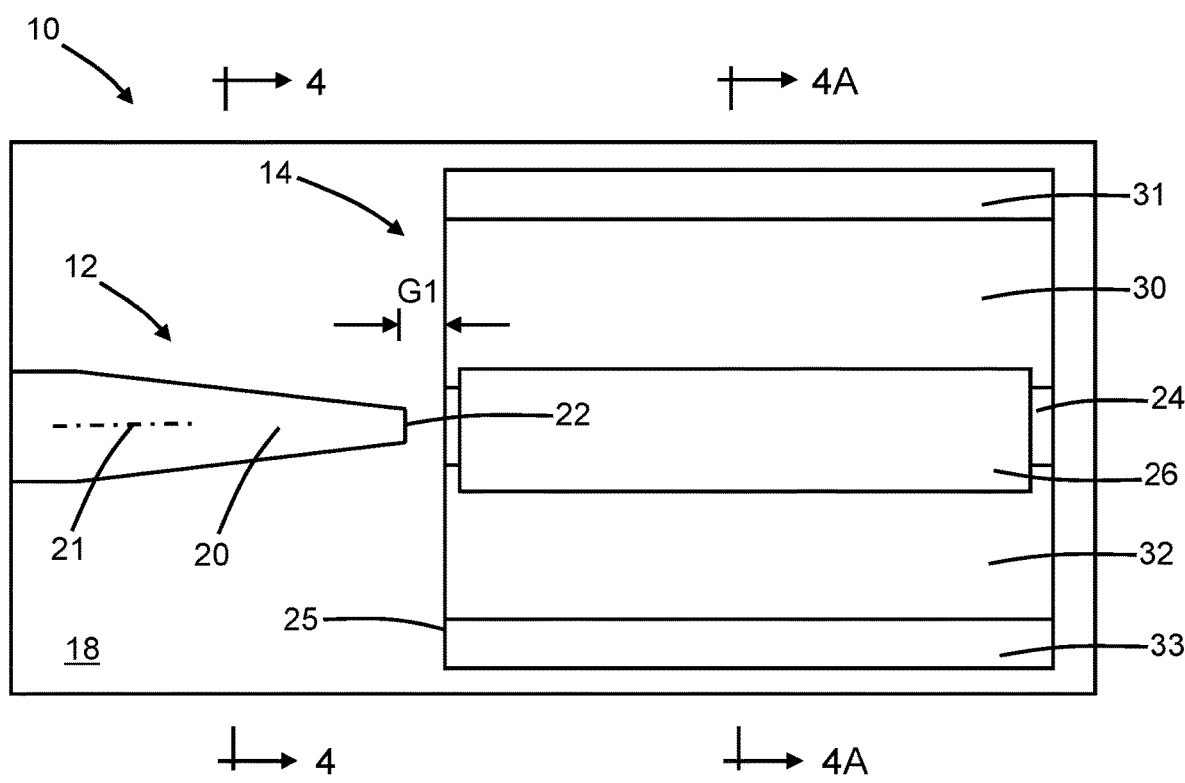
FIG. 3 is a top view of the structure at a fabrication stage subsequent to FIG. 1.
Figure 4:
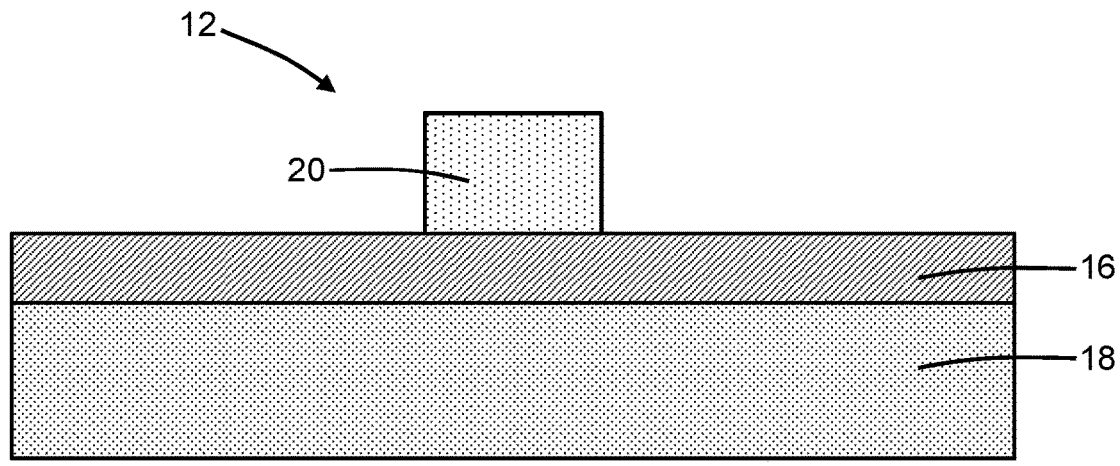
FIG. 4 is a cross-sectional view taken generally along line 4-4 in FIG. 3.
Figure 4A:
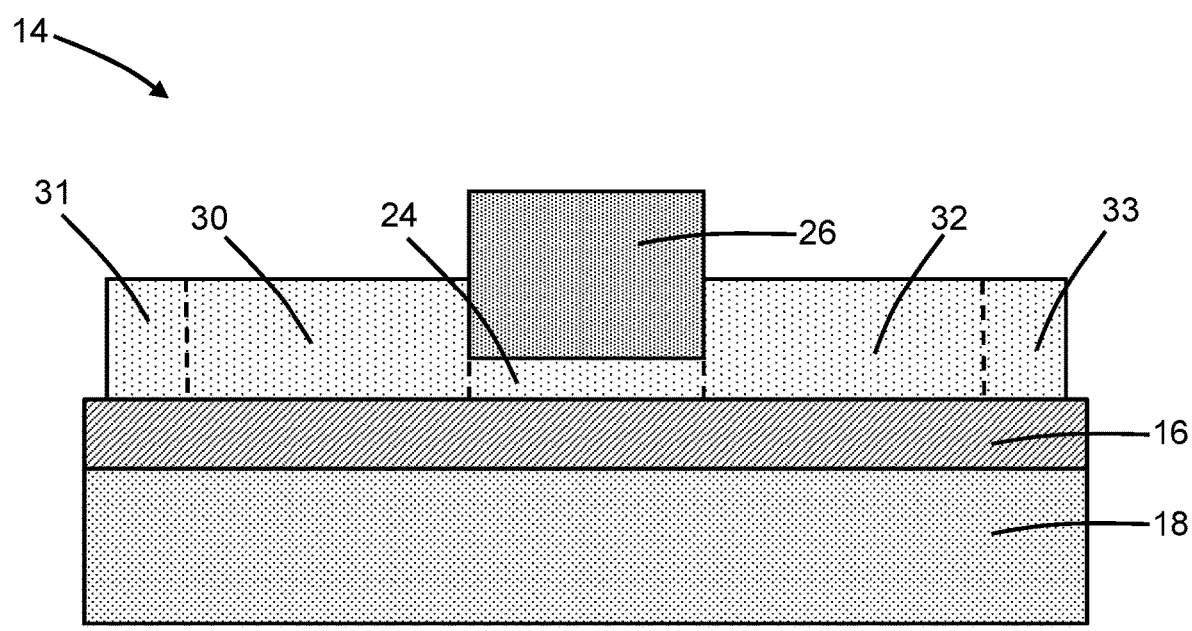
FIG. 4A is a cross-sectional view taken generally along line 4A-4A in FIG. 3.

With reference to FIGS. 3, 4, 4A in which like reference numerals refer to like features in FIGS. 1, 2, 2A and at a subsequent fabrication stage, the structure 10 may include a doped region 30 and a doped region 32 that are formed in respective portions of the pad 24. The doped regions 30, 32, which differ in conductivity type, may extend through the entire thickness of the pad 24 to the underlying dielectric layer 16. The light-absorbing layer 26 is laterally positioned between the doped region 30 and the doped region 32. The doped region 30 and the doped region 32 may be arranged adjacent to opposite side edges of the light-absorbing layer 26 to respectively define an anode and a cathode of the photodetector 14.

The doped region 30 may be formed by, for example, ion implantation with an implantation mask having an opening that determines an implanted portion of the pad 24. The implantation mask may include a layer of photoresist applied by a spin-coating process, pre-baked, exposed to light projected through a photomask, baked after exposure, and developed with a chemical developer to define the opening over the area to be implanted. The implantation conditions (e.g., ion species, dose, kinetic energy) may be selected to tune the electrical and physical characteristics of the doped region 30. The implantation mask may be stripped after forming the doped region 30. In an embodiment, the semiconductor material of the doped region 30 may contain a p-type dopant (e.g., boron) that provides p-type electrical conductivity. A portion of the light-absorbing layer 26 adjacent to the doped region 30 may be implanted with the p-type dopant due to overlap of the implantation mask.

The doped region 32 may be formed by, for example, ion implantation with an implantation mask with an opening that determines an implanted portion of the pad 24. The implantation mask may include a layer of photoresist applied by a spin-coating process, pre-baked, exposed to light projected through a photomask, baked after exposure, and developed with a chemical developer to define the opening over the area to be implanted. The implantation conditions (e.g., ion species, dose, kinetic energy) may be selected to tune the electrical and physical characteristics of the doped region 32. The implantation mask may be stripped after forming the doped region 32. In an embodiment, the semiconductor material of the doped region 32 may contain an n-type dopant (e.g., phosphorus and/or arsenic) that provides n-type electrical conductivity. A portion of the light-absorbing layer 26 adjacent to the doped region 32 may be implanted with the n-type dopant due to overlap of the implantation mask.

A portion of the pad 24 beneath the light-absorbing layer 26 may be comprised of intrinsic semiconductor material (e.g., intrinsic silicon) that is not doped when either of the doped regions 30, 32 is formed. The longitudinal axis 21 of the tapered section 20 may be aligned with the intrinsic portion of the pad 24. The doped region 30, the intrinsic semiconductor materials of the light-absorbing layer 26 and the portion of the pad 24 beneath the light-absorbing layer 26, and the doped region 32 may define a lateral p-i-n diode structure that is integrated into the photodetector 14.

A heavily-doped region 31 may be formed in a portion of the doped region 30, and a heavily-doped region 33 may be formed in a portion of the doped region 32. The heavily-doped regions 31, 33 are spaced outwardly from the opposite side edges of the light-absorbing layer 26. The heavily-doped region 31 may be doped to the same conductivity type as the doped region 30 but at a higher dopant concentration. The heavily-doped region 31 may be formed by selectively implanting ions, such as ions including the p-type dopant, with an implantation mask having an opening defining the intended location for the heavily-doped region 31 in the pad 24. The heavily-doped region 33 may be doped to the same conductivity type as the doped region 32 but at a higher dopant concentration. The heavily-doped region 33 may be formed by selectively implanting ions, such as ions including the n-type dopant, with an implantation mask having an opening defining the intended location for the heavily-doped region 33 in the pad 24.

In an alternative embodiment, the photodetector may have a vertical arrangement instead of a lateral arrangement. Specifically, in the vertical arrangement, the doped region 30 may be arranged below the light-absorbing layer 26, and the doped region 32 may be arranged above the light-absorbing layer 26.

Figure 5:
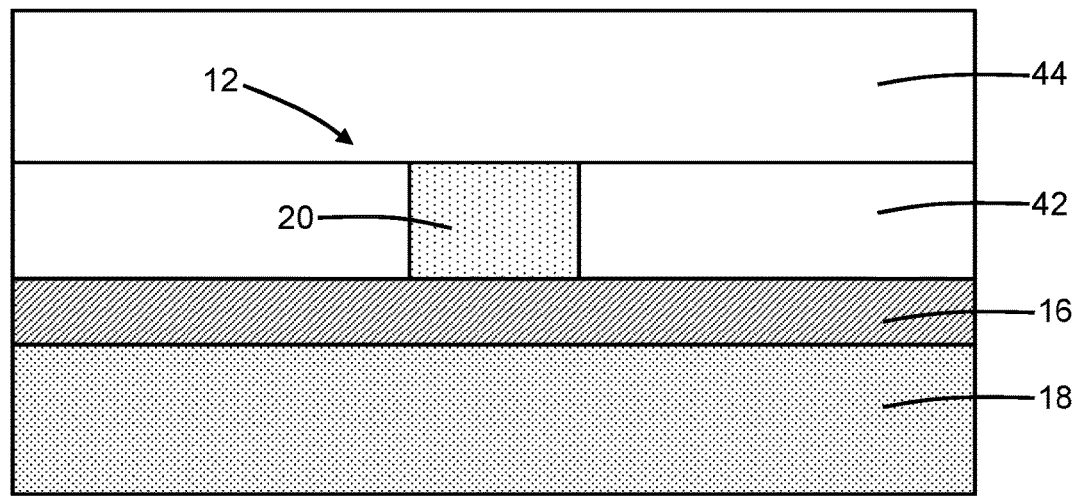
FIGS. 5, 5A are cross-sectional views of the structure at a fabrication stage subsequent to FIGS. 4, 4A.
Figure 5A:
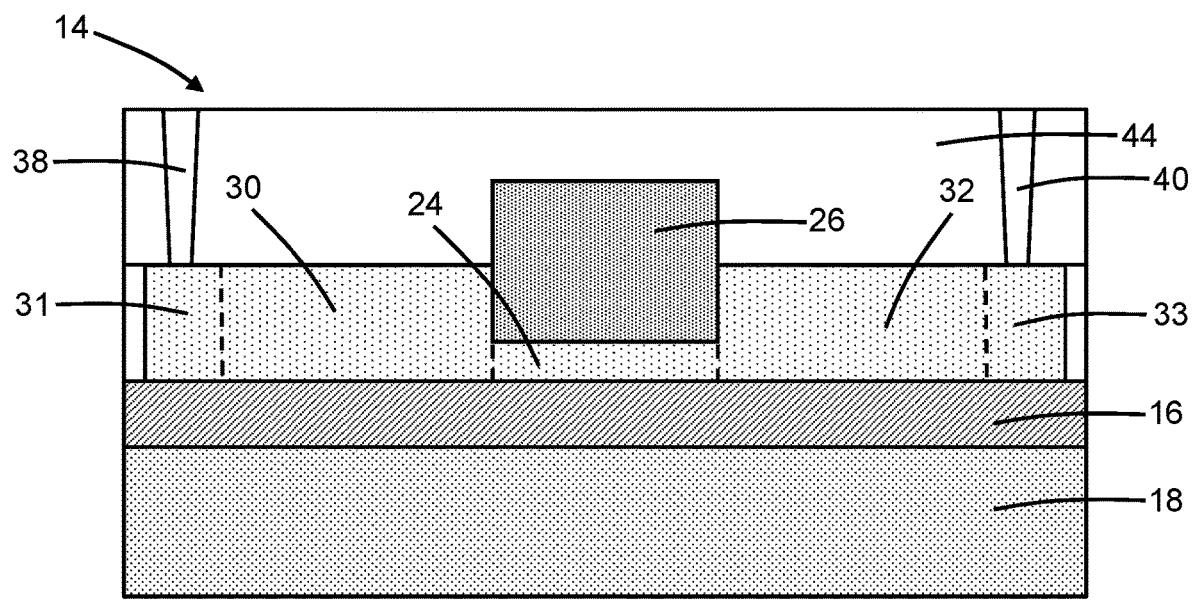

With reference to FIGS. 5, 5A in which like reference numerals refer to like features in FIGS. 4, 4A and at a subsequent fabrication stage, middle-of-line processing and back-end-of-line processing may follow, which includes formation of silicide, contacts, vias, and wiring for an interconnect structure that is coupled to the photodetector 14 of the structure 10. In particular, dielectric layers 42, 44 may be formed over the waveguide core 12 and photodetector 14, contacts 38 may be formed in the dielectric layers 42, 44 that land on the heavily-doped region 31, and contacts 40 may be formed in the dielectric layers 42, 44 that land on the heavily-doped region 33. The heavily-doped region 31 provides a reduced contact resistance and electrically couples the contacts 38 to the doped region 30. The heavily-doped region 33 provides a reduced contact resistance and electrically couples the contacts 40 to the doped region 32. The dielectric layer 42 may be comprised of a dielectric material, such as silicon dioxide, and the contacts 38, 40 may be comprised of a metal, such as tungsten. Dielectric material of the dielectric layer 42 fills the gap G1 between the tapered section 20 of the waveguide core 12 and the photodetector 14. The doped regions 30, 32 may be biased through the contacts 38, 40.

In use, light (e.g., laser light) propagates in the waveguide core 12 along the longitudinal axis 21 toward the photodetector 14 and is coupled from the tapered section 20 of the waveguide core 12 across the gap G1 to the light-absorbing layer 26 of the photodetector 14. The optical mode of the light expands in the gap G1 separating the tapered section 20 of the waveguide core 12 from the photodetector 14. The light-absorbing layer 26 absorbs photons of the light and converts the absorbed photons into charge carriers. The biasing of the doped regions 30, 32 causes the charge carriers to be collected and output to provide, as a function of time, a measurable photocurrent.

The tapering of the tapered section 20 of the waveguide core 12 with a width dimension that decreases with decreasing distance from the side edge 25 of the pad 24 improves the efficiency of the light coupling with the photodetector 14 by permitting expansion of the optical mode in the gap G1. The improvement in the efficiency of the light coupling may be optimized through selection of the dimension of the gap G1. The tapering of the tapered section 20 of the waveguide core 12 may reduce the polarization-dependent loss for transverse-magnetic polarized light. The tapering of the tapered section 20 of the waveguide core may also reduce mode mismatch and back reflection.

Figure 6:
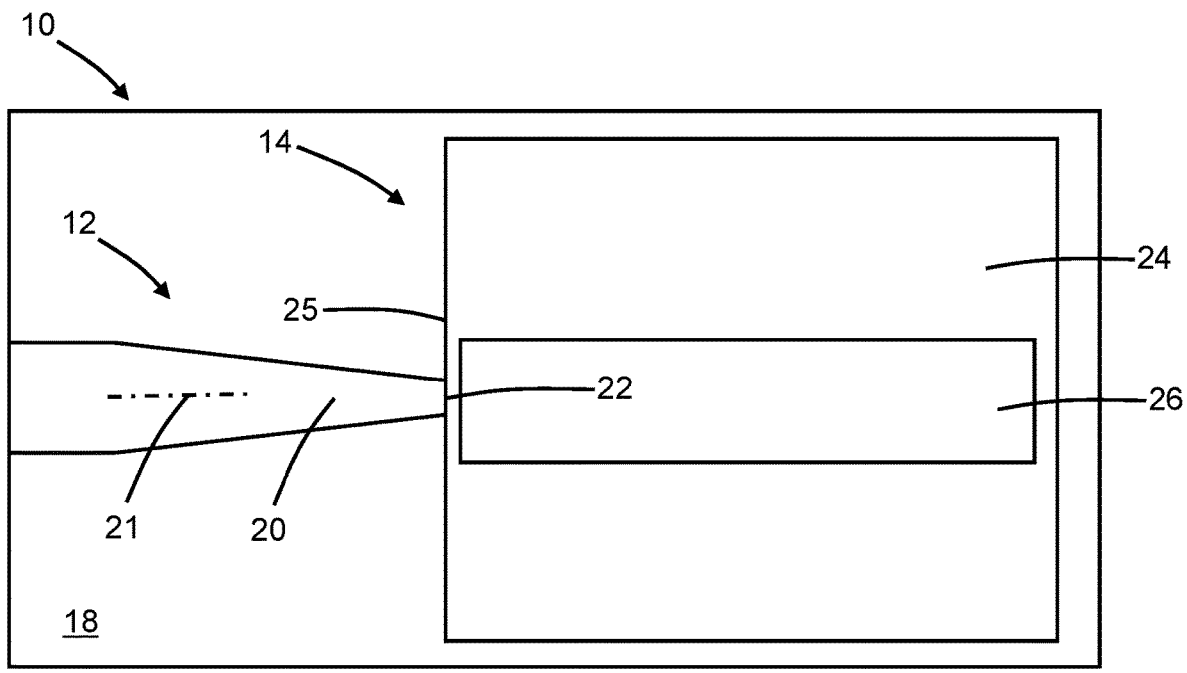
FIG. 6 is a top view of a structure in accordance with alternative embodiments of the invention.

With reference to FIG. 6 and in accordance with alternative embodiments, the tapered section 20 of the waveguide core 12 may abut the side edge 25 of the pad 24 of the photodetector 14 such that the gap G1 is absent. As a result, the end 22 of the tapered section 20 may directly contact the side edge 25 of the pad 24 such that the transition from the tapered section 20 to the pad 24 is continuous.

Figure 7:
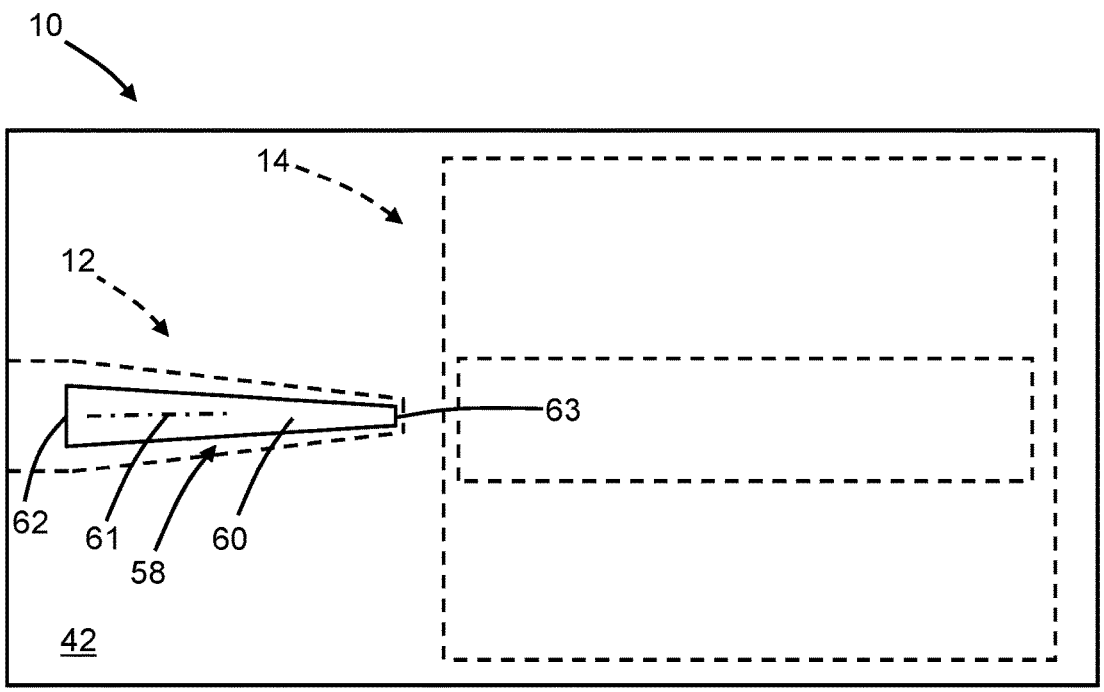
FIG. 7 is a top view of a structure in accordance with alternative embodiments of the invention.

With reference to FIG. 7 and in accordance with alternative embodiments, a waveguide core 58 may be formed on the dielectric layer 42 over the tapered section 20 of the waveguide core 12 as a coupling-assistance feature. The waveguide core 58 may improve the confinement of light in the tapered section 20 and, in particular, may improve the confinement of transverse-magnetic polarized light. The waveguide core 58 includes a tapered section 60 that is positioned to overlap with the tapered section 20 of the waveguide core 12 and that extends along a longitudinal axis 61. The tapered section 20 of the waveguide core 12 may be positioned in a vertical direction between the tapered section 60 of the waveguide core 58 and the semiconductor substrate 18.

The tapered section 60 may terminate at opposite ends 62, 63, and the width dimension of the tapered section 60 may decrease with decreasing distance from the end 63. In an embodiment, the width dimension of the tapered section 60 may decrease linearly with decreasing distance from the end 62. In an alternative embodiment, the width dimension of the tapered section 60 may vary based on a non-linear function, such as a quadratic function, a cubic function, a parabolic function, a sine function, a cosine function, a Bezier function, or an exponential function. In an embodiment, the tapered section 60 may include a single stage of tapering characterized by a taper angle. In an alternative embodiment, the tapered section 60 may taper in multiple stages each characterized by a different taper angle.

In an embodiment, the waveguide core 58 may be comprised of a material having a refractive index that is greater than the refractive index of silicon dioxide. In an embodiment, the waveguide core 58 may be comprised of a material having a different composition than the material of the waveguide core 12. In an embodiment, the waveguide core 58 may be comprised of polysilicon or amorphous silicon. In an embodiment, the waveguide core 58 may be formed by patterning a deposited layer comprised of the constituent material (e.g., polysilicon or amorphous silicon) with lithography and etching processes.

The coupling assistance provided by the waveguide core 58 may further improve the light coupling from the waveguide core 12 to the photodetector 14. The addition of the waveguide core 58 may also further reduce the polarization-dependent loss and, in particular, may further reduce the loss for transverse-magnetic polarized light.

Figure 8:
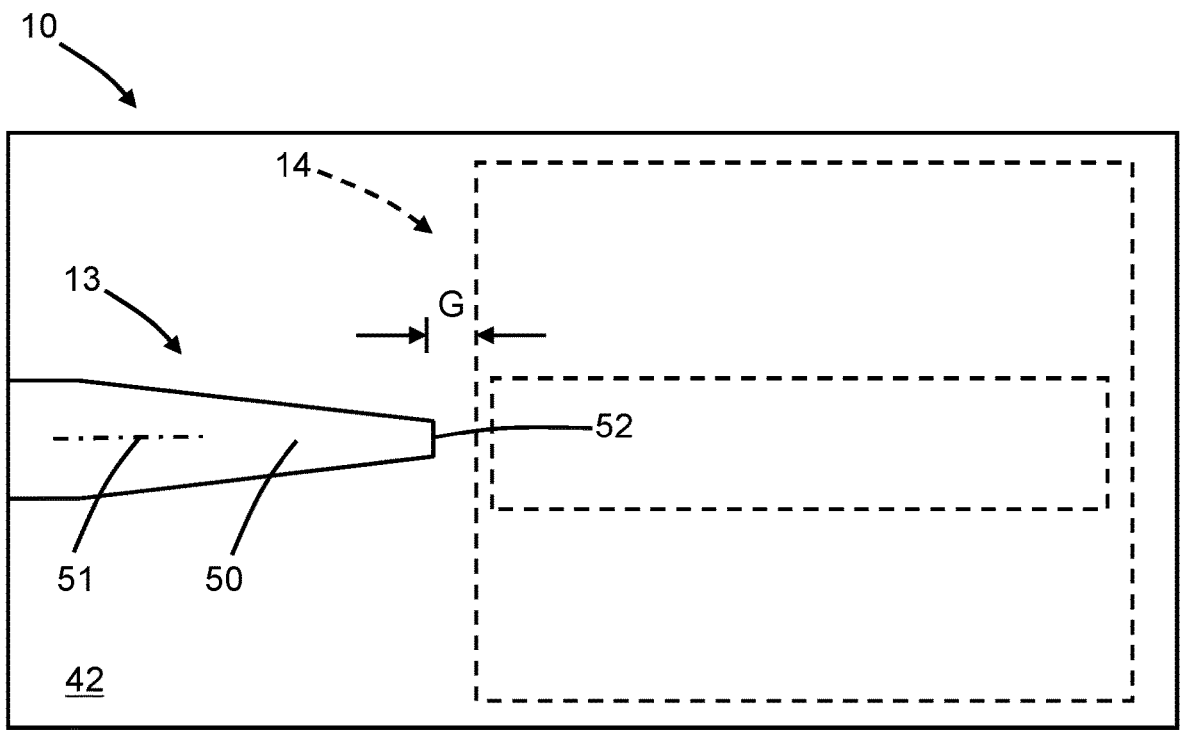
FIG. 8 is a top view of a structure in accordance with alternative embodiments of the invention.

With reference to FIG. 8 and in accordance with alternative embodiments, a waveguide core 13 may replace the waveguide core 12 and may be formed in a different elevation of the structure 10 than the photodetector 14. In an embodiment, the waveguide core 13 may be formed on the dielectric layer 42 by depositing a layer of its constituent material and patterning the deposited layer with lithography and etching processes. In an embodiment, the waveguide core 13 may be comprised of a material having a refractive index that is greater than the refractive index of silicon dioxide. In an embodiment, the waveguide core 13 may be comprised of a material having a different composition than the pad 24 of the photodetector 14. In an embodiment, the waveguide core 13 may be comprised of silicon nitride. In an embodiment, the waveguide core 13 may be comprised of aluminum nitride or silicon oxynitride.

The waveguide core 13 includes a tapered section 50 that is positioned adjacent to the photodetector 14 and that extends along a longitudinal axis 51. The tapered section 50 may terminate at an end 52, and the width dimension of the tapered section 50 may increase with increasing distance from the end 52 and decrease with decreasing distance from the side edge 25 of the pad 24. In an embodiment, the width dimension of the tapered section 50 may increase linearly with increasing distance from the end 52. In an alternative embodiment, the width dimension of the tapered section 50 may vary based on a non-linear function, such as a quadratic function, a cubic function, a parabolic function, a sine function, a cosine function, a Bezier function, or an exponential function. In an embodiment, the tapered section 50 may include a single stage of tapering characterized by a taper angle. In an alternative embodiment, the tapered section 50 may taper in multiple stages each characterized by a different taper angle.

The end 52 of the tapered section 50 may be horizontally spaced from the side edge 25 of the pad 24 of the photodetector 14 by the gap G1. In an embodiment, the end 52 of the tapered section 50 may be horizontally spaced from the nearest edge of the light-absorbing layer 26 by a gap that is slightly greater than the gap G1. Light is transferred diagonally from the tapered section 50 of the waveguide core 13 to the photodetector 14 with an optical mode that expands across the gap G1.

Figure 9:
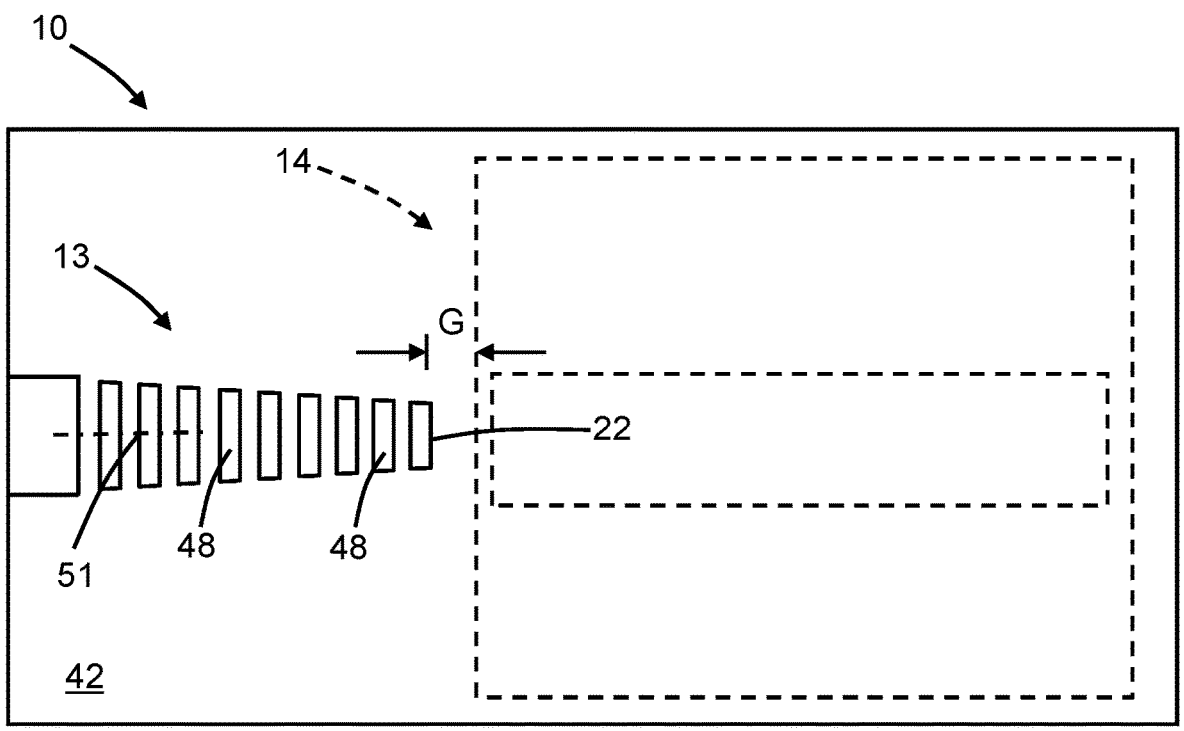
FIG. 9 is a top view of a structure in accordance with alternative embodiments of the invention.

With reference to FIG. 9 and in accordance with alternative embodiments, the tapered section 50 (FIG. 8) of the waveguide core 13 may be divided into segments 48 with respective width dimensions that follow the tapered envelope of the tapered section 50 and that have a spaced-apart arrangement along the longitudinal axis 51. The segment 48 closest to the side edge 25 of the pad 24 may have the smallest width dimension and may be separated from the side edge 25 of the pad 24 by the gap G1. In the representative embodiment, the segments 48 are disconnected from each other. In an embodiment, the pitch and duty cycle of the segments 48 may be uniform to define a periodic juxtaposed arrangement. In alternative embodiments, the pitch and/or the duty cycle of the segments 48 may be apodized (i.e., non-uniform) to define a non-periodic juxtaposed arrangement.

In an embodiment, the segments 48 may be dimensioned and positioned at small enough pitch so as to define a sub-wavelength grating that does not radiate or reflect light at a wavelength of operation. The dielectric material of the subsequently deposited dielectric layer 44 (FIGS. 5, 5A) is disposed in the spaces between adjacent pairs of the segments 48 such that a metamaterial structure is defined in which the material constituting the segments 48 has a higher refractive index than the dielectric material of the dielectric layer 44. The metamaterial structure can be treated as a homogeneous material having an effective refractive index that is intermediate between the refractive index of the material constituting the segments 48 and the refractive index of the dielectric material constituting the dielectric layer 44.

Figure 10:
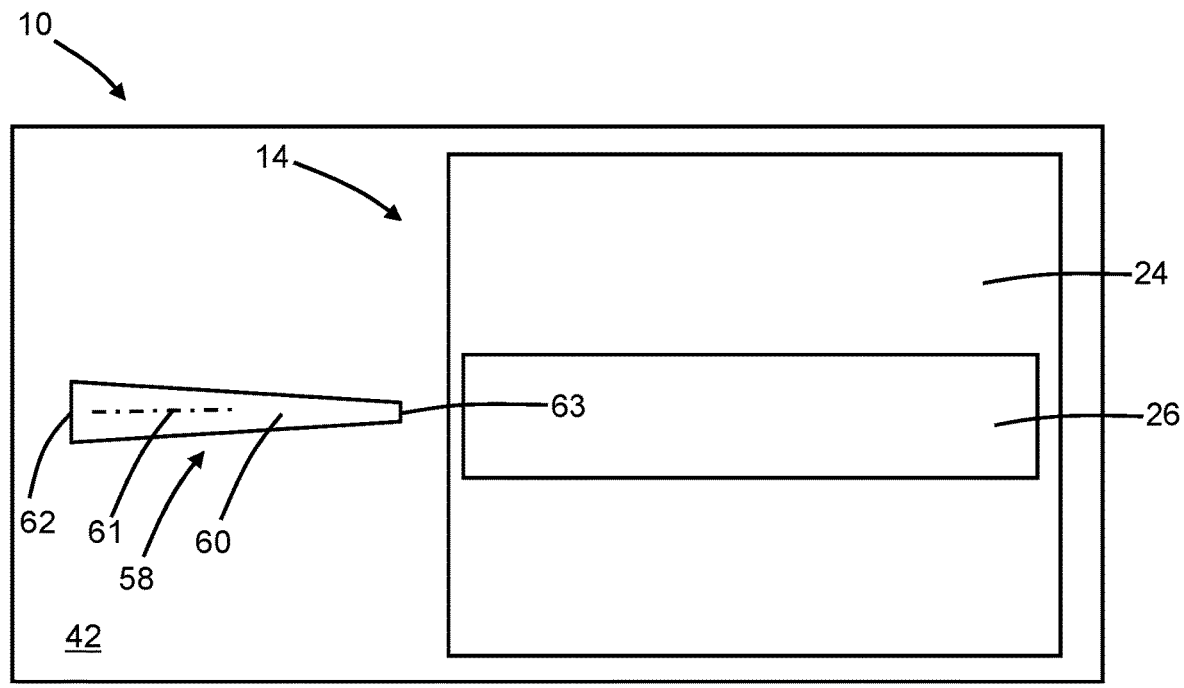
FIG. 10 is a top view of a structure in accordance with alternative embodiments of the invention.

With reference to FIG. 10 and in accordance with alternative embodiments, the waveguide core 58 may be formed at an elevation in the same level as the pad 24 of the photodetector 14 and may provide a coupling-assistance feature for the subsequently-formed waveguide core 13 (FIG. 8). The tapered section 50 of the waveguide core 13 may overlap with the tapered section 60 of the waveguide core 58, and the tapered section 60 of the waveguide core 58 may be positioned between the tapered section 50 of the waveguide core 13 and the semiconductor substrate 18. In an embodiment, the waveguide core 58 may be comprised of a semiconductor material. In an embodiment, the waveguide core 58 may be comprised of single-crystal silicon, and the waveguide core 58 may be patterned when the pad 24 of the photodetector 14 is patterned.

Figure 11:
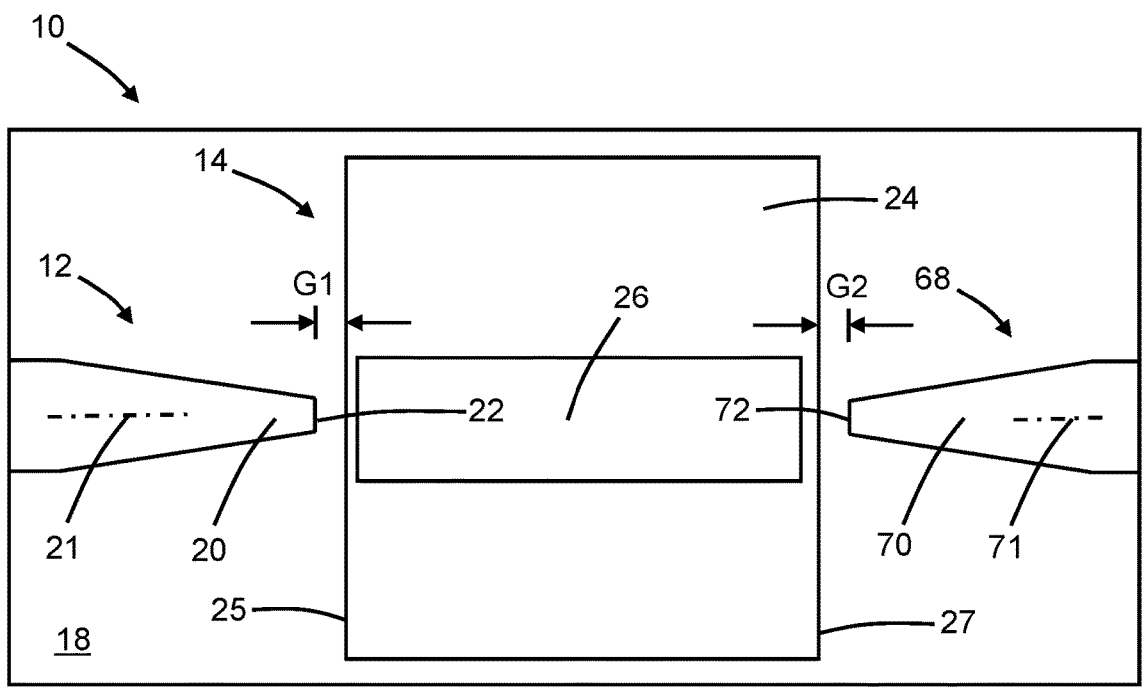
FIG. 11 is a top view of a structure in accordance with alternative embodiments of the invention.

With reference to FIG. 11 and in accordance with alternative embodiments, a waveguide core 68 may be disposed adjacent to a side edge 27 of the pad 24 of the photodetector 14 that is opposite from the side edge 25. The waveguide core 68 may supply another input to the photodetector in addition to the input provided by the waveguide core 12. For example, the total power delivered to the photodetector 14 may be split between the input provided by the waveguide core 12 and the input provided by the waveguide core 68.

The waveguide core 68 includes a tapered section 70 that is positioned adjacent to the photodetector 14 and that extends along a longitudinal axis 71. The tapered section 70 may terminate at an end 72, and the width dimension of the tapered section 70 may increase with increasing distance from the end 72 and decrease with decreasing distance from the side edge 27 of the pad 24. In an embodiment, the end 72 of the tapered section 70 may be spaced from the side edge 27 of the pad 24 of the photodetector 14 by a gap G2, and the end 72 of the tapered section 70 may be spaced from the nearest edge of the light-absorbing layer 26 by a gap that is slightly greater than the gap G2. In an alternative embodiment, the tapered section 70 may adjoin the pad 24 such that the gap G2 is absent.

In an embodiment, the width dimension of the tapered section 70 may increase linearly with increasing distance from the end 72. In an alternative embodiment, the width dimension of the tapered section 70 may vary based on a non-linear function, such as a quadratic function, a cubic function, a parabolic function, a sine function, a cosine function, a Bezier function, or an exponential function. In an embodiment, the tapered section 70 may include a single stage of tapering characterized by a taper angle. In an alternative embodiment, the tapered section 70 may taper in multiple stages each characterized by a different taper angle.

In an alternative embodiment, a waveguide core similar to the waveguide core 58 may added over the waveguide core 12 as a coupling-assistance feature, and a waveguide core similar to the waveguide core 58 may added over the waveguide core 68 as a coupling-assistance feature. In an alternative embodiment, the waveguide core 68 may be disposed at an elevation in the same level as the waveguide core 13 (FIG. 8) and may supply another input to the photodetector 14 in addition to the input provided by the waveguide core 13, and a coupling-assistance feature may be optionally added beneath each of the waveguide cores 13, 68.

Figure 12:
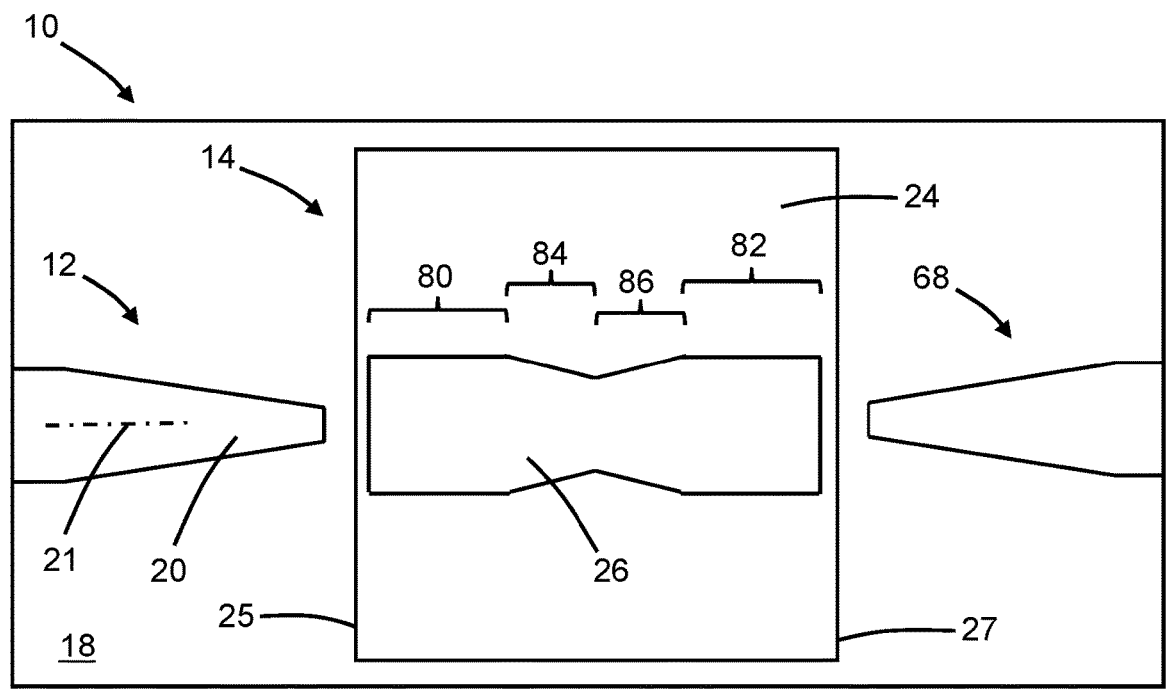
FIG. 12 is a top view of a structure in accordance with alternative embodiments of the invention.

With reference to FIG. 12 and in accordance with alternative embodiments, the light-absorbing layer 26 of the photodetector 14 may be modified to have a non-rectangular shape. In an embodiment, the light-absorbing layer 26 may include a non-tapered section 80, a non-tapered section 82, and tapered sections 84, 86 that are arranged between the non-tapered section 80 and the non-tapered section 82. The tapered sections 84, 86 may be configured to taper in opposite directions and to adjoin at their respective narrow ends with the wide end of the tapered section 84 adjoining the non-tapered section 80 and the wide end of the tapered section 86 adjoining the non-tapered section 82. The tapered section 84 has a width dimension that decreases with decreasing distance from the tapered section 86, and the tapered section 86 has a width dimension that decreases with decreasing distance from the tapered section 84.

Figure 13:
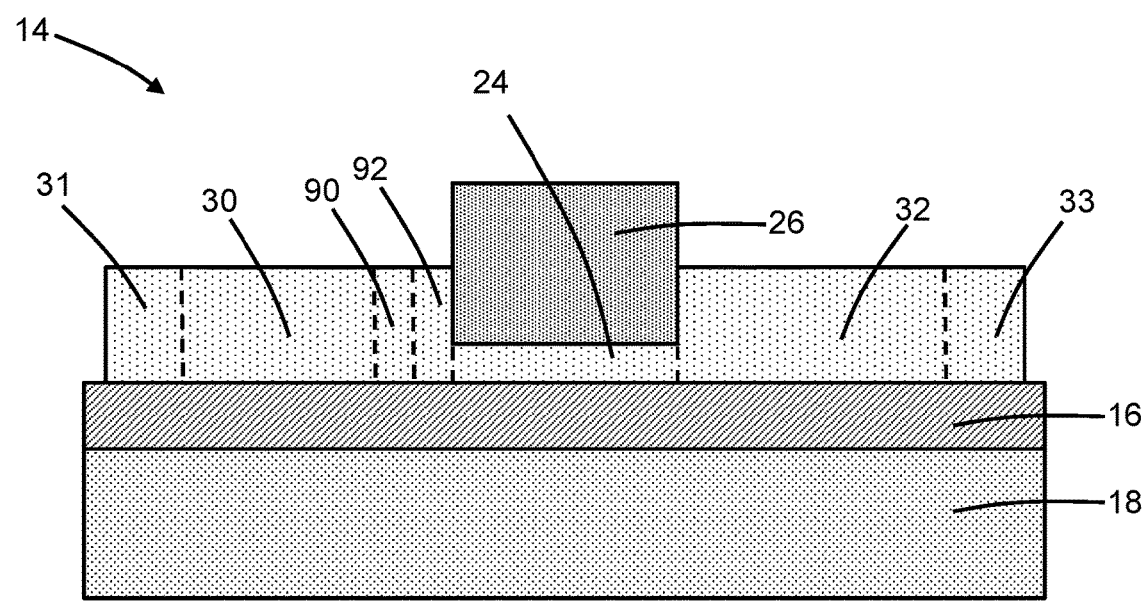
FIG. 13 is a cross-sectional view of a structure in accordance with alternative embodiments of the invention.

With reference to FIG. 13 and in accordance with alternative embodiments, the photodetector 14 may be configured as an avalanche photodetector that includes an intrinsic semiconductor region 90 defining a multiplication region and a doped region 92 defining a charge control region. The intrinsic semiconductor region 90 is positioned between the doped region 92 and the doped region 30, and the doped region 92 has an opposite conductivity type from the doped region 30. Incident radiation is absorbed in the absorption region defined by the light-absorbing layer 26 and electron-hole pairs are generated, and signal amplification occurs in the multiplication region defined by the intrinsic semiconductor region 90. The charge control region provided by the doped region 92 may be effective to control the electric field in the multiplication and absorption regions. In use, an avalanche current is generated in the multiplication region by the creation of additional electron-hole pairs through impact ionization.

In an alternative embodiment, the avalanche photodetector may have a vertical arrangement instead of a lateral arrangement. Specifically, in the vertical arrangement, the doped region 30 may be arranged above the light-absorbing layer 26, the intrinsic semiconductor region 90 may be arranged below the light-absorbing layer 26, the doped region 92 may be arranged between the intrinsic semiconductor region 90 and the light-absorbing layer 26, the doped region 32 may be laterally offset relative to the intrinsic semiconductor region 90 to permit contact landing.

Figure 14:
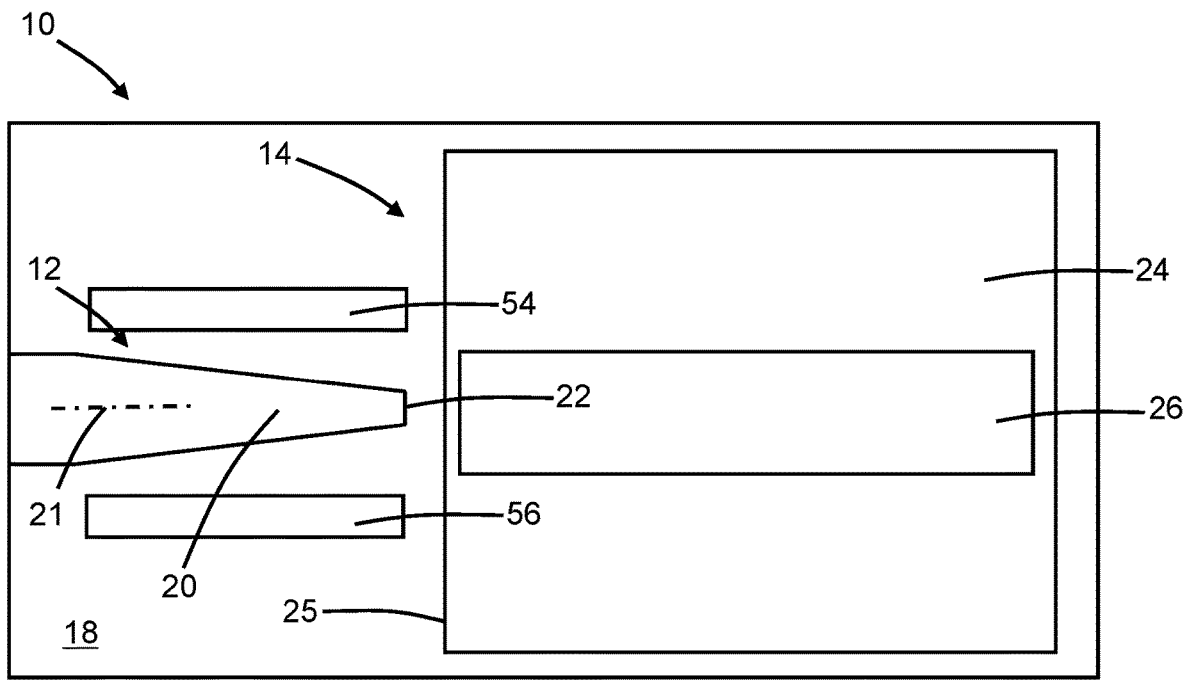
FIG. 14 is a top view of a structure in accordance with alternative embodiments of the invention.

With reference to FIG. 14 and in accordance with alternative embodiments, the structure 10 may include waveguide core segments 54, 56 that are positioned adjacent to the tapered section 20 of the waveguide core 12 with the tapered section 20 disposed laterally between the waveguide core segment 54 and the waveguide core segment 56. Each of the waveguide core segments 54, 56 terminates at opposite ends with one of the ends terminating adjacent to the end 22 of the tapered section 20. The tapered section 20 and the waveguide core segments 54, 56 may define a multi-tip arrangement, and may be expanded to add one or more additional waveguide core segments.

Figure 15:
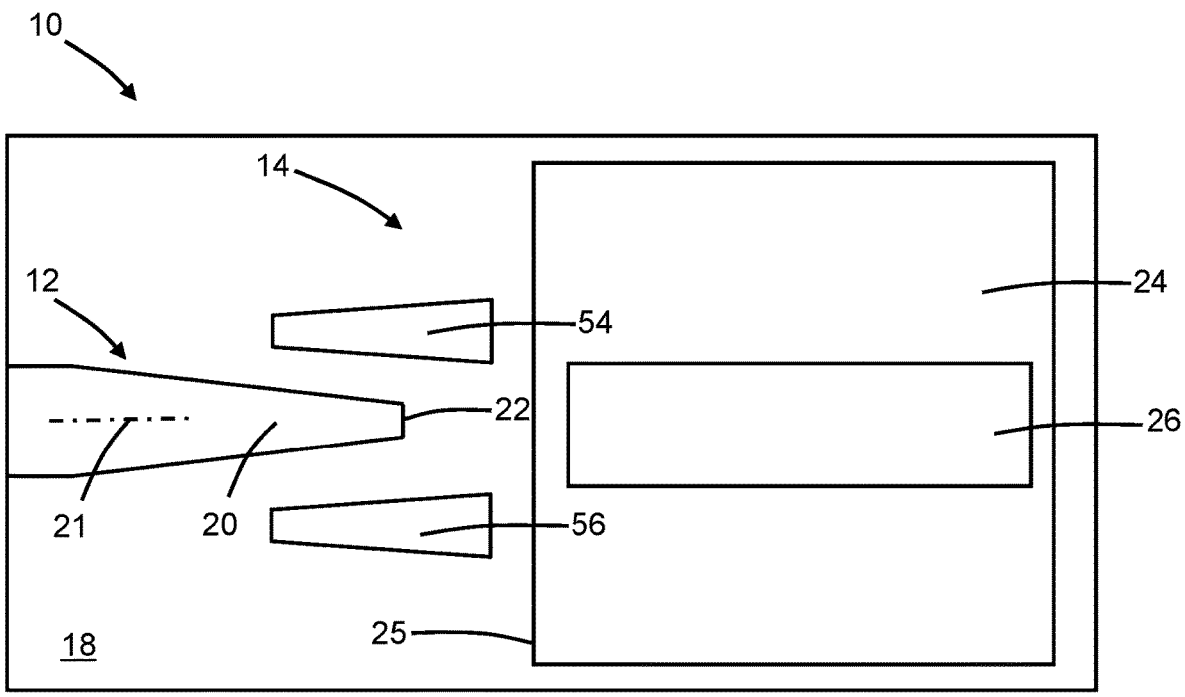
FIG. 15 is a top view of a structure in accordance with alternative embodiments of the invention.

With reference to FIG. 15 and in accordance with alternative embodiments, the waveguide core segments 54, 56 may be lengthwise tapered with a width dimension that increases with decreasing distance from the side edge 25 of the pad 24. The waveguide core segments 54, 56 may also be longitudinally offset relative to the end 22 of the tapered section 20 of the waveguide core 12 such that portions of the waveguide core segments 54, 56 are closer to the side edge 25 than the tapered section 20.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate;
   a dielectric layer on the semiconductor substrate;
   a photodetector above the dielectric layer and the semiconductor substrate, the photodetector including a pad having a first side edge and a light-absorbing layer disposed on the pad, and the light-absorbing layer including a first tapered section and a second tapered section adjoined to the first tapered section; and
   a first waveguide core above the dielectric layer and the semiconductor substrate, the first waveguide core including a tapered section positioned adjacent to the first side edge of the pad and the light-absorbing layer, and the tapered section of the first waveguide core having a first width dimension that decreases with decreasing distance from the first side edge of the pad,
   wherein the first tapered section of the light-absorbing layer has a second width dimension that decreases with decreasing distance from the second tapered section of the light-absorbing layer, and the second tapered section of the light-absorbing layer has a third width dimension that decreases with decreasing distance from the first tapered section of the light-absorbing layer.

2. The structure of claim 1 wherein the tapered section of the first waveguide core has an end that is spaced from the first side edge of the pad by a gap.

3. The structure of claim 2 wherein the gap is less than or equal to two microns.

4. The structure of claim 1 wherein the tapered section adjoins the first side edge of the pad.

5. The structure of claim 1 further comprising:
   a second waveguide core including a tapered section having a first end and a second end opposite to the first end,
   wherein the tapered section of the second waveguide core overlaps with the tapered section of the first waveguide core.

6. The structure of claim 5 wherein the first waveguide core comprises a first material, and the second waveguide core comprises a second material having a different composition from the first material.

7. The structure of claim 1 further comprising:
   a second waveguide core including a tapered section having a first end and a second end opposite to the first end,
   wherein the tapered section of the first waveguide core overlaps with the tapered section of the second waveguide core.

8. The structure of claim 7 wherein the first waveguide core comprises a first material, and the second waveguide core comprises a second material having a different composition from the first material.

9. The structure of claim 1 wherein the pad of the photodetector has a second side edge opposite from the first side edge, the light-absorbing layer is disposed on the pad between the first side edge and the second side edge, and further comprising:
a second waveguide core including a tapered section positioned adjacent to the second side edge of the pad and the light-absorbing layer, the tapered section of the second waveguide core having a fourth width dimension that decreases with decreasing distance from the second side edge of the pad.

10. The structure of claim 9 wherein the light-absorbing layer is positioned between the tapered section of the first waveguide core and the tapered section of the second waveguide core.

11. The structure of claim 1 further comprising:
a first waveguide core segment adjacent to the tapered section of the first waveguide core; and
a second waveguide core segment adjacent to the tapered section of the first waveguide core,
wherein the tapered section of the first waveguide core is laterally positioned between the first waveguide core segment and the second waveguide core segment.

12. The structure of claim 11 wherein the first waveguide core segment is tapered and the second waveguide core segment is tapered.

13. The structure of claim 1 wherein the tapered section of the first waveguide core includes a plurality of segments.

14. The structure of claim 1 wherein the first waveguide core and the pad comprise single-crystal silicon.

15. The structure of claim 14 wherein the tapered section of the first waveguide core has an end that is spaced from the first side edge of the pad by a gap.

16. The structure of claim 1 wherein the first waveguide core comprises a first material, and the pad comprises a second material having a different composition from the first material.

17. The structure of claim 16 wherein the tapered section of the first waveguide core has an end that is spaced from the first side edge of the pad by a gap.

18. The structure of claim 1 wherein the light-absorbing layer is positioned on a portion of the pad comprising an intrinsic semiconductor material, and further comprising:
a first doped region in the pad, the first doped region having a first conductivity type; and
a second doped region in the pad, the second doped region having a second conductivity type opposite to the first conductivity type,
wherein the portion of the pad is positioned in a lateral direction between the first doped region and the second doped region.

* * * * *